United States Patent [19]

Belt et al.

[11] Patent Number: 4,970,060
[45] Date of Patent: Nov. 13, 1990

[54] PURE OR MIXED MONOCRYSTALLINE BOULES OF LANTHANUM ORTHOGALLATE

[75] Inventors: Roger F. Belt, Morristown; Robert Uhrin, Brookside, both of N.J.

[73] Assignee: Litton Systems, Inc., Morristown, N.J.

[21] Appl. No.: 470,333

[22] Filed: Jan. 25, 1990

Related U.S. Application Data

[62] Division of Ser. No. 164,235, Mar. 4, 1988, Pat. No. 4,944,833.

[51] Int. Cl.$^5$ .................. C04B 35/46; B01J 17/18
[52] U.S. Cl. ......................... 423/593; 156/617.1; 252/521; 420/555
[58] Field of Search ............ 252/521; 156/617.1; 423/593; 420/555

[56] References Cited

FOREIGN PATENT DOCUMENTS 266751  2/1973  U.S.S.R. .

OTHER PUBLICATIONS

E. J. Baran—Infrared Spectrum of LaGaO$_3$; 1975; pp. 3572–3575, Naturforsch; National Unversity of LaPlata, Argentina, pp. 136–137.
J. Yang et al.—On the Luminescence of Perovskite Type Rare Earth Gallates; 1985; New Front. Rare Earth Sci., vol. 2, pp. 860–863.
G. Sallavuard et al.—Lanthanide Monogallates; Mar. 1969; C. R. Academy of Sciences, Paris; pp. 1050–1053.
M. Mizuno et al.—Phase Diagram of the System Gallium Trioxide—Lanthanum Oxide at High Temps.; Gov't. Industrial Research Institute, 1985; pp. 295–300.
D. Lefebvre et al.—Substituted Lanthanum Hexagallates a . . . Substrates; Materials Research Bulletin, vol. 22; pp. 1039–1045, (1987).
G. F. Ruse et al.—Growth of Neodymium Gallium Oxide Crystals; Journal of Crystal Growth, 29, (1975), pp. 305–308.

*Primary Examiner*—Upendra Roy
*Attorney, Agent, or Firm*—Michael H. Wallach; Robert F. Rotella

[57] ABSTRACT

Monocrystalline lanthanum orthogallate compositions grown along a predetermined crystallographic direction in the form of a single crystal of a size greater than 1 cm in diameter/width and at least 10 cm in length are described. Such compositions include mixed crystal monocrystalline lanthanum orthogallates wherein a portion of the lanthanum is replaced with a rare earth element of smaller ionic radius than lanthanum and/or a portion of the gallium is replaced with Al, Sc or In. The foregoing monocrystalline compositions are particularly suited as superconductor substrates.

24 Claims, No Drawings

PURE OR MIXED MONOCRYSTALLINE BOULES OF LANTHANUM ORTHOGALLATE

This is a divisional of copending application Ser. No. 07/164,235 filed on Mar. 4, 1988 now U.S. Pat. No. 4,944,833.

BACKGROUND OF THE INVENTION

I. Field of the Invention

This invention relates to the field of crystal formation, in particular the invention involves lanthanum orthogallate and a method which allows lanthanum orthogallate to be produced in the form of a large perovskite-type single crystals. Specifically, the invention relates to the discovery that single crystals of lanthanum orthogallate may be grown from a pure melt of lanthanum and gallium oxides while controlling the major crystallographic direction of solidification.

II. Description of the Prior Art

The mineral perovskite ($CaTiO_3$) serves as a prototype crystal structure for a large class of compounds of general formula $ABO_3$. In this structure, the A element is a large cation while the B element is a smaller cation. In order to maintain charge neutrality in the compound, the sum of the cation valence states should total six. Thus, various combinations of A and B valence states are possible, e.g. 3—3, 2–4, 1–5 and even mixed fractional compositions. The ideal perovskite crystal structure is cubic where 8(A)ions are located at the cube corners, 6(O)ions at the cube faces and a single B ion at the cube center. In a practical situation, most perovskite structures are distorted from cubic to tetragonal, rhombohederal, or orthorhombic crystal forms. The perovskite structure is likely to be generated where A cations are coordinated with 12 oxygen ions and B cations with 6 oxygen. It was shown first by V. M. Goldschmidt in Skrifter Norske Videnskops-Akad, Oslo, I, Mat. - Naturv. Kl., No. 8 (1926) that a cubic perovskite is stable only if a tolerance factor has an approximate range of $0.8 < t < 0.9$. Here t is defined by $R_A$ & $R_O = t\sqrt{2} (R_B + R_O)$ where $R_A$, $R_B$, and $R_O$ are ionic radii of the A, B, and O ions respectively. For distorted structures, t may have a larger tolerance. The perovskite structure is very important as a basis for semiconductors, thermoelectrics, ferroelectrics, laser hosts, catalysts, and ferromagnetic materials. A modern discussion of these applications is given in the book "Structure, Properties, and Preparation of Perovskite - Type Compounds" by F. S. Galasso, Pergamon Press, New York, 1969. The perovskite related high Tc superconductor oxides of type $La_{1.85}Ba_{0.15}CuO_{4-x}$ and $YBa_2Cu_3O_{7-x}$, which were discovered in 1987, have again brought this structure into technical prominence. $ABO_3$ compounds other than $CaTiO_3$ (perovskite) which possess the perovskite crystal structure are alternatively referred to as "perovskite-type", "perovskite-like" or "perovskite-related". As used herein when referring to compositions other than $CaTiO_3$, the term "perovskite" describes the crystalline structure of such compositions.

The compound $LaGaO_3$ was prepared first as a polycrystalline powder, characterized, and reported as a perovskite-like structure by S. Geller, in Acta Cryst. 10, 243 (1957). Geller determined by X-ray diffraction, the structure at room temperature to be an orthorhombic crystal with the following unit cell dimensions: a=5.496 A, b=5.524 A, and c=7.787 A. Small single crystals, ca, 1-5 mm in size, were grown from a $PbO-B_2O_3$ flux as reported by M. Marezio, J. P. Remeika and P. D. Dernier in Inorganic Chemistry 7, 1337 (1968). These workers again determined the crystals to be orthorhombic with the following lattice constant: a=5.526 A b=5.473 A and c=7.767 A. Several years later a reinvestigation of the $La_2O_3-Ga_2O_3$ system by solid state reaction showed a similar result for $LaGaO_3$. See S. Geller, P. J. Curlander and G. F. Ruse in Mat. Res. Bull. 9, 637 (1974) Geller reported measurement of the orthorhombic unit cell as follows: a=5.519 A, b=5.494 A, and c=7.770 A.

The phase diagram of the $La_2O_3-Ga_2O_3$ system was studied in a preliminary fashion by S. J. Schneider, R. S. Roth and J. L. Waring, J. Research Natl, Bur. Standards 65A [4] 365 (1961). Schneider et al. found that the perovskite phase existed at the stoichiometric 1:1 composition. However, it was not indicated whether this composition or those adjacent within a few mole percent were either congruently or incongruently melting. Generally mixtures of a high melting component ($La_2O_3$) with a partially volatile low melting component such as $Ga_2O_3$ are difficult to control compositionally at or near the melting point of the stoichiomitric mix. In accordance with the art it would have been expected that use of a pure melt, and crystal formation therefrom, e.g. by the Czochralski growth technique at ordinary pressure would not succeed.

III. Invention Contrasted From the Prior Art

In accordance with the present invention, it has unexpectedly been found contrary to what is suggested by previous investigators that powdered stoichiometric mixtures of $La_2O_3$ and $Ga_2O_3$ at the 1:1 $Ga_2O_3$ composition melt stably and apparently congruently with little or no evolution of $Ga_2O_3$; that the resulting stable melts of about 1:1 composition are low melting, circa 1675° C. by uncorrected pyrometer, a temperature near the $Ga_2O_3$ melting point; that such pure melts can be formed and retained in iridium crucibles for sufficient time to practice the Czochralski method of growth; that such melts can be seeded by an iridium wire to obtain a single perovskite-type crystal near a preferred [110] orientation; and, that seeded growth via oriented single crystals can produce large boules in [110] orientation or other favorable orientations, viz. [100], [010], or [001].

Additionally the prior art (preparation of single crystals by the flux technique) teaches away from the present invention since crystallization normally proceeds in all directions simultaneously away from an initial nucleus.

SUMMARY OF THE INVENTION

It is the object of the present invention to obtain lanthanum orthogallate monocrystals grown along predetermined crystallographic directions of useful size for applications requiring sizes exceeding those of the randomly grown minutely sized crystals of the prior art, described above.

In its broad aspect the present invention relates to monocrystalline lanthanum orthogallate grown along the predetermined crystallographic direction. The monocrystalline lanthanum orthogallate is in the form of a single crystal of a size greater than 1 cm in diameter/width and at least 10 cm in length.

In accordance with the present invention a new class of perovskite type monocrystalline substrates has been developed. The class of materials is based on lanthanum orthogallate which has been discovered to readily grow from a pure melt along a predetermined crystallographic direction. Included in the class of suitable perovskite-type monocrystalline substrates are single crystals of the following formulae:

$$LaGa_{1-x}Sc_xO_3 \qquad 1.$$

$$LaGa_{1-x}Al_xO_3 \qquad 2.$$

$$LaGa_{1-x}In_xO_3 \qquad 3.$$

wherein x may be 0.001–0.5 and for most applications is 0.01–0.2.

The present invention thus also relates to single crystals such as monocrystalline $LaGa_{1-x}Sc_xO_3$ wherein x may be 0.001–0.5 and for most applications is 0.01–0.2, grown along a predetermined crystallographic direction and monocrystalline $LaGa_{1-x}Al_xO_3$ wherein x may be 0.001–0.5 and for most applications is 0.01–0.2, grown along a predetermined crystallographic direction.

Likewise, a mixed single crystal of composition $LaGa_{1-x}In_yO_3$, where x may be 0.001–0.5 and for most applications is 0.01–0.2, can be grown to "tune" the lattice unit cell.

The compositions in which either Sc, Al or In are substituted for Ga in the crystal structure allow for the manipulation of the lattice constant of the monocrystalline substrate.

Also included in the class of suitable perovskite-type monocrystalline substrates are single crystals of the following formula:

$$R_xLa_{1-x}GaO_3$$

wherein R is a rare earth element of smaller ionic radius than La and wherein x may be 0.001–0.5 and for most applications is 0.01–0.2.

In addition, the class of suitable perovskite-type monocrystalline substrates includes single crystals of the following formulae:

$$R_xLa_{1-x}Ga_{1-y}Al_yO_3$$

$$R_xLa_{1-x}Ga_{1-y}Sc_yO_3$$

$$R_xLa_{1-x}Ga_{1-y}In_yO_3$$

wherein R is a rare earth element of smaller ionic radius than La and wherein x and y may be the same or different and are within the range of from 0.001 to 0.5 and for most applications is 0.01–0.2.

Where it is desirable to increase the lattice constant in addition to, or as an alternative for, substitution of $Al^{3+}$ for $Ga^{3+}$ it is possible to use $In^{3+}$ in place of $Al^{3+}$. $Fe^{3+}$ should not be used because of its ferromagnetic properties.

It is also possible, in accordance with this invention, to decrease the lattice constant by substituting rare earth elements of smaller ionic radii for La. The rare earth elements that can be substituted for La are: Ce, Pr, Nd, Pm, Sm, Eu, Gd, Tb, Dy, Ho, Er, Tm, Yb and Lu. Where a colorless substrate is desired then the rare earth elements/metals that can be substituted for La are Gd, Yb, Lu and Y.

The mixed single crystals of the present invention can readily be grown in dimensions greater than 1 cm in diameter and 10 cm in length and in-boule sizes equivalent to those of the monocrystalline lanthanum orthogallate of the present invention.

The monocrystalline materials of the present invention are particularly adapted to function as lattice-matched substrates. Specifically such materials may be used as substrates to form a superconducting device comprising a lattice-matched substrate on which a film is deposited of high Tc superconducting metal oxide based perovskite.

Another aspect of the present invention relates to a method of growing a monocrystalline lanthanum orthogallate along a predetermined crystallographic direction. The method comprises the steps of forming a mixture of $La_2O_3$ and $Ga_2O_3$; heating said mixture to form a melt of uniform composition in a controlled atmosphere; and, cooling said melt to form said monocrystalline lanthanum orthogallate. Preferably the mixture of $La_2O_3$ and $Ga_2O_3$ is stoichiometric.

The amounts of ingredients in the stoichiometric mixture can vary from the exact stoichiometric quantities calculated from the monocrystalline product. Variations of up to about ±5 percent can be tolerated without adversely affecting the desired oriented single crystalline product. Thus for purposes of calculating stoichiometric ratio variations of ±2 percent can be tolerated.

Yet another aspect of the present invention involves growing monocrystalline lanthanum orthogallate by the Czochralski method. This method comprises the steps of forming a mixture of $La_2O_3$ and $Ga_2O_3$ preferably in stoichiometric amounts; heating said mixture to form a melt of uniform composition in a controlled atmosphere; initiating growth of said crystal on nucleating means for holding and pulling said crystal from the melt; and pulling the crystal formed on the nucleating means. The nucleating means is preferably an oriented seed crystal, although it has been found in accordance with the present invention that the nucleating means may be an inert material stable at the temperature of the melt, e.g. iridium. The controlled atmosphere may be inert, an oxidizing atmosphere or a reducing atmosphere.

DETAILED DESCRIPTION OF THE INVENTION

The purity of the oxides that are mixed to form the melt suitably is at least about 99.9%. Oxide purity of about 99.99% or greater is preferably used. In accordance with the present invention boules of a size of about 0.7 inch diameter or greater and 4 inch in length or larger are obtained and sizes of 1 inch or greater diameter and 5–6 inches in length or even larger are capable of being grown using a pure melt. In accordance with the present invention, monocrystalline lanthanum orthogallate may be formed using a pure melt (a melt consisting essentially of $La_2O_3$ and $Ga_2O_3$) in sizes of at least one centimeter in diameter and 10 cm. in length. A substantially stoichiometric ratio of $La_2O_3$ and $Ga_2O_3$ is used to form a uniform pure melt for monocrystalline lanthanum gallate.

It is possible to obtain a monocrystalline product utilizing admixtures of lanthanum and gallium oxides outside the stoichiometric ratios required for lanthanum orthogallate formation but not necessarily with the same results; that is, variations in the refractive index and crystal quality may occur.

The crystal is suitably formed at atmospheric conditions that are oxidizing although the stability of the melt is such that it is also possible to use inert atmospheric conditions. The use of an oxidizing atmosphere to suppress reduction of gallium oxide component of the mix is preferred. It should also be pointed out that the type of atmosphere used varies in accordance with the method of manufacture of the monocrystalline materials of the present invention. For certain applications, such as where a doped lanthanum orthogallate is made by introduction of impurity cations which function as laser activators, e.g., where trivalent uranium ($U^{3+}$) and titanium ($Ti^{3+}$) cations are added as laser activators, it may be advantageous to grow the doped lanthanum orthogallate crystal in a reducing atmosphere.

Growth of monocrystalline lanthanum orthogallate can be in the [001], [010] or [100] orientations or in alternate orientations selected depending on the specific application for which the resulting crystal is to be used.

Large high optical quality single crystals of $LaGaO_3$ are useful as laser hosts. To form a laser material, any trivalent lasing ion of the rare earth series (La to Lu) or the actinide series (U to Lr) may be substituted for the $La^{3+}$ in significant amounts. In the rare earth series, La, Gd and Lu are not lasing ions, the remaining elements of the series are all capable of acting as laser activators in accordance with the present invention, though not necessarily with the same result. Furthermore, the large size of the $La^{3+}$ determines a favorable distribution coefficient, k, (where k is close to unity), for incorporating impurity ions of the foregoing type. For tunable lasers, the trivalent ions of the transition elements, e.g., $Cr^{3+}$ or $Ti^{3+}$, can be substituted in the octahedral $Ga^{3+}$ sites in $LaGaO_3$. Lasers employing an energy transfer, e.g. $Cr^{3+}$ to $Nd^{3+}$ or several rare earths such as Er, Tm, Ho, may also be constructed with $LaGaO_3$. The most useful growth directions of doped monocrystalline $LaGaO_3$ are [010] and [001] with significant differences in threshold, gain, polarization, and other active lasing parameters.

The doped crystal laser rods of the present invention have a wavefront distortion $< \frac{1}{8}\lambda$ per cm. length at lasing wavelength ($\lambda$) of 1.064 $\mu$m and an optical loss $<0.005$ per cm. length. Laser rod sizes generally are larger than about 3 mm in width/diameter and 25 mm in length for laser applications involving 10–100 mW outputs. Generally for applications involving 100–500 mW outputs larger rods sizes are suitable such as ($7\times75$), ($10\times100$), or ($15\times125$) mm.

Large single crystals of $LaGaO_3$ are also useful as a substrate material for deposition of oxidic superconductor single crystal thin films. For $LaGaO_3$, the lattice spacing of (110) planes is about 3.894. The superconducting compound defined by the formula $YBa_2Cu_3O_{7-x}$ has an orthorhombic crystal structure with a=3.856 A, b=3.870 A, and c=11.666 A as reported by T. Siegrist, S. Sunshine, D. W. Murphy, R. J. Cava and S. M. Zahurak, Phys. Rev. B35, 7137 (1987). It is a known principle of epitaxial film growth that similar crystal structure and nearly matching lattice constants provide the most favorable situation for high quality film deposition. (See L. I. Maissel and R. Glang, Editors, "Handbook of Thin Film Technology", I. H. Khan, Chapter 10, McGraw Hill, New York, 1970). In the superconductor materials of the present invention the 3.894 A spacing for (110) oriented $LaGaO_3$ wafers falls ideally near both the 3.856 A axis and 3.870 A b axis spacings of $YBa_2Cu_3O_{7-x}$. Thus, (110) oriented single crystal films of $YBa_2Cu_3O_{7-x}$ are favorably disposed to form on (110) $LaGaO_3$ with a minimum of strain, twins, or other defects which may limit the superconducting properties. In fact, the strain is measured commonly by lattice constant variation. For $LaGaO_3$ these would be 100 (3.894 A−3.856 A)/3.894 A or +1.0% and 100 (3.894 A−3.870 A)/3.894 or +0.6% respectively for the a and b axes of $YBa_2Cu_3O_{7-x}$. If a slightly different lattice constant for the substrate is desirable, mixed single crystals of composition $LaGa_{1-x}Al_xO_3$ or $LaGa_{1-x}Sc_xO_3$, where x=0.001–0.2, can be grown to "tune" the lattice unit cell by virtue of the smaller ($Al^{3+}$) or larger ($Sc^{3+}$) ionic radii.

The substrate monocrystalline lanthanum gallate and/or "tuned" mixed single crystals of $LaGa_{1-x}Al_xO_3$ or $LaGa_{1-x}Sc_xO_3$, where x=0.0–0.2 should be substantially lattice-matched with the supported superconductor. As used herein substantially lattice-matched means that the respective lattices of substrate and superconductor may vary $\pm 2\%$. Preferably, the variation is $\pm 1\%$ or less.

To obtain the substrates of the present invention from a single crystal boule of $LaGaO_3$ or mixed crystals the procedure indicated below is typical.

After the $LaGaO_3$ oriented single crystal boule is grown, the ends are cut off flat by a saw. The boule is then polished on its ends for a complete optical inspection by ordinary and laser light. Another 1 mm slice from the boule is taken to perform a chemical etch test for defects and lattice constant measurement by X-ray diffractometer. The boule is then ground to a cylinder by centerless grinding for round substrates or ground flat for square wafers. The boule is next mounted on a dop to perform an X-ray orientation to $\pm 0.1°$. The particular planes, e.g., (110) planes of $LaGaO_3$, are now parallel to each saw cut for a wafer. The boule is then completely cut into wafers on an inside diameter diamond wafering saw. Each wafer is about 1 mm thick for the rough cut. The wafers are mounted on metal blocks, lapped to flatness and parallelism by means of a planetary lapping machine, and then removed. Wafers are then given a chemical etch to remove all surface damage incurred by previous mechanical processes. The wafers are next polished by a Syton chemical-mechanical process to give a damage-free epitaxial growth surface. Wafers are then removed, inspected, cleaned, and ready for film deposition. Film deposition in the case of metal oxide based perovskite superconductors can be achieved in accordance with any of the well known deposition techniques for such superconductor materials. One acceptable procedure is that described by T. Venkatesan in the Dec., 1987 issue of *Solid State Technology* in his article entitled "Laser Deposited High Tc Superconducting Thin Films."

EXAMPLE I (Growth of $LaGaO_3$)

A single crystal of lanthanum orthogallate ($LaGaO_3$) was grown in a furnace arrangement consisting of a $2\times2$ inch cylindrical iridium crucible supported by a zirconia tube and entirely surrounded by zirconia grog for thermal insulation. Additional insulation for the growing crystal was provided by a $3\times3$ inch cylindrical zirconiz sleeve situated above and concentric to the crucible. The component oxides are purchased as free flowing microcrystalline solid powders in a size range of approximately 1–10 $\mu$m. Power for melting the oxides and maintaining the crystal diameter was provided by a 350K Hz induction generator supplying a 10 turn coil located external to a quartz tube which held the ceramic elements and crucible in place. The growth furnace was isolated from the ambient atmosphere by means of a water cooled metal enclosure.

A melt comprised of lanthanum orthogallate was established by introducing a stoichiometric mixture of 330.2 g of 99.99% purity lanthanum oxide and 189.8 g of 99.99% purity gallium oxide into the iridium crucible. Power to the crucible was increased until the contents were completely molten. In the absence of a lanthanum orthogallate seed, an iridium wire was then lowered into the melt in order to nucleate a crystal. Following initial crystallization, the wire was withdrawn at 1.25 mm per hour while rotating at 25 rpm. The entire melting and crystal growth procedure was conducted in a controlled atmosphere comprised of 99.5% $N_2$ flowing at 21 liter/minute and 0.5% $Co_2$ flowing at 0.1 liter/minute.

An oxidizing atmosphere was chosen to counteract the anticipated loss of gallium oxide through volatilization. Loss by this mechanism was found to be negligible, however. In addition, the melting point was found to be much lower than expected. The temperature of the melt was approximately 1650° C.

The lanthanum orthogallate, as observed, congruently melted at or very near its stoichiometric composition. X-ray powder diffraction confirmed that the crystallized phase was lanthanum orthogallate.

The size of the grown crystal was 22 mm diameter $\times$ 84 mm long, and its single crystal nature was confirmed by the appearance of well-defined spots in a Laue back reflection x-ray photograph. The axial orientation of the crystal was close to [110].

EXAMPLE II (Growth of LaGaO$_3$)

After the growth of the initial crystal, where a substantial portion (37%) of the melt was crystallized and removed, a second crystal was grown under the same conditions as before. Oxide components equal to the composition of the grown crystal, i.e. 121.9 g of La$_2$O$_3$ and 70.1 g of Ga$_2$O$_3$, were intimately mixed and added to the crucible containing the residual solidified melt. The component oxides are purchased as free flowing microcrystalline solid powders in a size range of approximately 1-10 um. The temperature of the growth station was increased until the entire crucible contents had melted. An iridium wire was then lowered into the melt and crystallization was conducted as before. The previous observations of a relatively low melting point and good melt stability were replicated. A substantial portion (36%) of the melt was again crystallized with no indication of changes in the crystallized phase associated with a deviating melt composition.

The crystal measured 19 mm in diameter and 102 mm in length and was confirmed to be a single crystal of [001] orientation by Laue x-ray back reflection.

An X-ray powder pattern confirmed the LaGaO$_3$ composition and lattice constants.

The above procedure of melt addition and regrowth is normally not attainable in other Ga$_2$O$_3$ containing systems, e.g. Gd$_3$Ga$_5$O$_{12}$, because of substantial deviations in composition brought about by Ga$_2$O$_3$ volatility.

EXAMPLE III (Growth of Doped Lanthanum Gallate)

A single crystal of lanthanum orthogallate doped with 1 atomic percent neodymium was grown using a growth furnace arrangement similar to the prior examples. In this case an iridium crucible 75 mm in diameter and 75 mm high was used with an upper insulating sleeve measuring 100 mm diameter and 100 mm high. An intimate mixture comprised of 1070.0 g lanthanum oxide, 9.2 g neodymium oxide and 620.7 g gallium oxide was introduced to the crucible. All reagents were 99.99% purity. The component oxides are purchased as free flowing microcrystalline solid powders in a size range of approximately 1-10 um. Power to the iridium crucible was increased until the contents were completely molten. A seed of lanthanum orthogallate oriented with its [001] axis parallel to the withdrawal direction was brought into contact with the melt. Growth was initiated by withdrawing the seed at 1.25 mm per hour while rotating at 30 rpm. When the crystal attained a length of 100 mm at 25 mm diameter, it was extracted from the melt and cooled. The crystal was processed by end cutting, optical examination, and core drilling of a 5$\times$50 mm cylindrical laser rod. The rod, when finished optically to laser specifications, AR coated, and subjected to active laser testing, functions as an active laser.

A laser rod formed from the Nd-doped boule of lanthanum orthogallate meets the optical requirements of the laser rods of the present invention and will have a wavefront distortion of less than $\frac{1}{8}$ per cm length at a wavelength of 1.064 um and an optical loss of less than 0.005 per cm length.

EXAMPLE IV (Formation of Laser Crystal)

In order to prepare a laser crystal of composition La$_{0.99}$Nd$_{0.01}$GaO$_3$ where 1% of the La$^{3+}$ sites are occupied by Nd$^{3+}$, the following procedure is followed. A powdered mixture of La$_2$O$_3$, Nd$_2$O$_3$ and Ga$_2$O$_3$ is prepared in the molar ratio of 0.99:0.01:1.00 respectively. The component oxides are purchased as free flowing microcrystalline solid powders in a size range of approximately 1-10 um. This powdered mixture is melted in the same manner as pure LaGaO$_3$. A single crystal is then grown from the melt. An oriented seed crystal of LaGaO$_3$ can be used to control the orientation of the boule and laser rod. The amount of the impurity ion (Nd$^{3+}$) in the crystal will, in general, not be exactly equal to that formulated in the melt. The amount is governed by the segregation coefficient k defined by the relation $k = c_s/C_L$, where $c_s$ is the Nd solid concentration and $C_L$ is the liquid concentration. Values of k larger than unity are to be expected because the La$^{3+}$ has an ionic radius larger than the other rare earths.

EXAMPLE V (Growth of Mixed Crystals)

Mixed single crystals are prepared by fixing the proportions of LaAlO$_3$ and LaGaO$_3$ in the starting compositions. Since both compounds have nearly an identical perovskite structure, the X-ray lattice constants in the mixed crystal are proportional to the amount of each component. An example is given in Table I where the measured lattice constants of pure LaAlO$_3$, LaGaO$_3$, and LaScO$_3$ are given. The calculated values for 50—50 mole % mixtures of LaAlO$_3$-LaGaO$_3$ and LaGaO$_3$-LaScO$_3$ are given. Other intermediate values are achieved in a similar manner.

TABLE I

Lattice Constants of Perovskites

| Compound | a(A) | b(A) | c(A) |
|---|---|---|---|
| $LaAlO_3$ | 5.356 | 5.356 | 7.600 |
| *$LaAl_{0.5}Ga_{0.5}O_3$ | 5.438 | 5.425 | 7.685 |
| $LaGaO_3$ | 5.519 | 5.494 | 7.770 |
| *$LaGa_{0.5}Sc_{0.5}O_3$ | 5.600 | 5.640 | 7.934 |
| $LaScO_3$ | 5.678 | 5.787 | 8.098 |

*Calculated values.

EXAMPLE VI (Growth of Mixed Crystals to Attain a Specific Lattice Constant Match)

This example relates to the proper attainment of a near lattice constant match for a mixed crystal of $La_{1-x}R_xGa_{1-y}Al_yO_3$ type where R us a smaller rare earth ion such as $Gd^{3+}$ or $Y^{3+}$. Suppose we wish to deposit a thin film of the $YBa_2Cu_3O_{7-x}$ compound on the (110) planes of an appropriate perovskite substrate to obtain minimum deviation from lattice match. We note that for $YBa_2Cu_3O_{7-x}$ the orthorhombic unit cell is a=3.856 A, b=3.870 A, and c=11.666 A from T. Siegrist et al., phys. Rev. B35, 7137 (1987).

Since one lattice spacing $d_{110}$ of a substrate may not exactly match more than one spacing of the film, we may want to choose an approximate compromise for the film, e.g. an average between the a=3.856 A and the b=3.870 A or 3.863 A. Thus, the design of substrate with a lattice spacing of 3.863 A is now considered. We do this with the assistance of Table II. The first five entries of Table II are measured orthorhombic lattice constants of pure phases of respective pervoskites. The last three entries are for proposed mixed crystal compositions which exactly satisfy the $d_{110}$ lattice spacing of the required 3.863 A. In these calculations it is assumed that a nearly linear change of a, b, or c is occurring with composition. Thus, the actual measured a, b, and c of the mixed crystal may deviate slightly from these calculated values. Other examples of lattice match procedures are evident from the above.

In order to prepare these mixed single crystals, appropriate molar ratios of the respective oxides are incorporated into the melt prior to crystal growth. For example, to prepare the $La_{0.6}Y_{0.4}GaO_3$ composition, 0.6 mole of $La_2O_3$, 0.4 mole of $Y_2O_3$, and 1.0 mole of $Ga_2O_3$ can be introduced into the crucible. Some correction may have to be made for segregation, since k=Cs/Cl may not be exactly 1 for Gd, Y, or Al in $LaGaO_3$. Examples for other mixed crystals are treated similarly.

TABLE II

Lattice Constants of Perovskites

| | a | b | c | d 110 |
|---|---|---|---|---|
| $LaAlO_3$ | 5.356 | 5.356 | 7.600 | 3.787 |
| $LaGaO_3$ | 5.519 | 5.494 | 7.770 | 3.894 |
| $LaScO_3$ | 5.678 | 5.787 | 8.098 | 4.053 |
| $GdGaO_3$ | 5.537 | 5.322 | 7.606 | 3.837 |
| $YGaO_3$ | 5.536 | 5.257 | 7.533 | 3.812 |
| *$LaAl_{0.3}Ga_{0.7}O_3$ | 5.470 | 5.453 | 7.719 | 3.863 |
| *$La_{0.5}Gd_{0.5}GaO_3$ | 5.527 | 5.405 | 7.686 | 3.863 |
| *$La_{0.6}Y_{0.4}GaO_3$ | 5.528 | 5.387 | 7.628 | 3.863 |

*Calculated

As is evident from the foregoing, various modifications can be made without departing from the spirit of the invention. It is not intended to limit the invention to the details heretofore recited, the invention being defined in the claims which follow.

We claim:

1. Monocrystalline lanthanum orthogallate in either pure or mixed crystal form grown from a pure melt along a predetermined crystallographic direction; said monocrystalline lanthanum orthogallate being in the form of a single crystal having dimensions greater than 1 cm in diameter and 10 cm in length.

2. The monocrystalline lanthanum orthogallate of claim 1, further characterized in that the lanthanum orthogallate crystal is a mixed crystal lanthanum orthogallate wherein a portion of the Ga is replaced with Sc, Al or In.

3. The monocrystalline lanthanum orthogallate of claim 1, further characterized in that the lanthanum orthogallate crystal is a mixed crystal lanthanum orthogallate wherein a portion of the lanthanum is replaced with a rare earth element of smaller ionic radius than lanthanum, said mixed crystal lanthanum orthogallate being characterized by the formula $R_xLa_{1-x}GaO_3$ wherein R is a rare earth element of smaller ionic radius than La and wherein x=0.001 to 0.5.

4. The monocrystalline lanthanum orthogallate of claim 1, further characterized in that the lanthanum orthogallate crystal is a mixed crystal lanthanum orthogallate wherein a portion of the lanthanum orthogallate is replaced with a rare earth element of smaller ionic radius than La and wherein a portion of the Ga is replaced with Al, said crystal lanthanum orthogallate being characterized by the formula $R_xLa_{1-x}Ga_{1-y}Al_yO_3$ wherein R is a rare earth element of smaller ionic radius than La and wherein x and y are the same or different and have a value of from 0.001 to 0.5.

5. The monocrystalline lanthanum orthogallate of claim 1, further characterized in that the lanthanum orthogallate crystal is a mixed crystal lanthanum orthogallate wherein a portion of the lanthanum orthogallate is replaced with a rare earth element of smaller ionic radius than La, wherein a portion of the Ga is replaced with Sc, said crystal lanthanum orthogallate being characterized by the formula $R_xLa_{1-x}Ga_{1-y}Sc_yO_3$ wherein R is a rare earth element of smaller ionic radius than La and wherein x and y are the same or different and have a value of from 0.001 to 0.5.

6. The monocrystalline lanthanum orthogallate of claim 1, further characterized in that the lanthanum orthogallate crystal is a mixed crystal lanthanum orthogallate wherein a portion of the lanthanum orthogallate is replaced with a rare earth element of smaller ionic radius than La, wherein a portion of the Ga is replaced with In, said crystal lanthanum orthogallate being characterized by the formula $R_xLa_{1-x}Ga_{1-y}In_yO_3$ wherein R is a rare earth element of smaller ionic radius than La and wherein x and y are the same or different and have a value of from 0.001 to 0.5.

7. The mixed crystal monocrystalline lanthanum orthogallate of claim 2, further characterized by the formula $La\ Ga_{1-x}Sc_xO_3$ wherein x=0.001–0.5.

8. The mixed crystal monocrystalline lanthanum orthogallate of claim 2, further characterized by the formula $La\ Ga_{1-x}Al_xO_3$ wherein x=0.001–0.5.

9. The mixed crystal monocrystalline lanthanum orthogallate of claim 33, further characterized by the formula $La\ Ga_{1-x}In_xO_3$ wherein x=0.001–0.5.

10. The monocrystalline composition of claim 3, wherein x=0.01–0.2.

11. The monocrystalline composition of claim 3 wherein R is Y.

12. The monocrystalline composition of claim 4, wherein x=0.01–0.2.

13. The monocrystalline composition of claim 4 wherein R is Y.

14. The monocrystalline composition of claim 5, wherein x=0.01–0.2.

15. The monocrystalline composition of claim 5 wherein R is Y.

16. The monocrystalline composition of claim 6 wherein x=0.01–0.2.

17. The monocrystalline composition of claim 6 wherein R is Y.

18. The monocrystalline composition of claim 7, wherein x=0.01–0.2.

19. The monocrystalline composition of claim 8, wherein x=0.01–0.2.

20. The monocrystalline composition of claim 9, wherein x=0.01–0.2.

21. The monocrystalline composition of claim 11 wherein x=0.01–0.2.

22. The monocrystalline composition of claim 13 wherein x=0.01–0.2.

23. The monocrystalline composition of claim 15 wherein x=0.01–0.2.

24. The monocrystalline composition of claim 17 wherein x=0.01–0.2.

* * * * *